United States Patent
Wong et al.

(10) Patent No.: US 6,616,031 B2
(45) Date of Patent: Sep. 9, 2003

(54) APPARATUS AND METHOD FOR BOND FORCE CONTROL

(75) Inventors: Sun Kuen Wong, Kowloon (HK); Ming Yeung Luke Wan, Kwai Chung (HK)

(73) Assignee: ASM Assembly Automation Limited (HK)

(*) Notice: Subject to any disclaimer, the term of this patent is extended or adjusted under 35 U.S.C. 154(b) by 0 days.

(21) Appl. No.: 09/905,906

(22) Filed: Jul. 17, 2001

(65) Prior Publication Data

US 2003/0015569 A1 Jan. 23, 2003

(51) Int. Cl.[7] .......................... B23K 31/02; B23K 37/00
(52) U.S. Cl. .......................... 228/102; 228/8; 228/235.1
(58) Field of Search ................. 228/102, 103, 228/8, 9, 180.1, 180.21, 180.22, 180.5, 4.5, 234.1, 235.1, 110.1, 1.1

(56) References Cited

U.S. PATENT DOCUMENTS

| | | | |
|---|---|---|---|
| 3,727,822 A | | 4/1973 | Umbaugh |
| 3,940,047 A | * | 2/1976 | Laub et al. .................... 228/32 |
| 4,266,710 A | * | 5/1981 | Bilane et al. ................. 228/4.5 |
| 4,597,522 A | * | 7/1986 | Kobayashi ............... 228/180.5 |
| 4,603,802 A | | 8/1986 | Kurtz et al. |
| 4,850,780 A | * | 7/1989 | Safabakhsh et al. ..... 414/416.1 |
| 5,138,127 A | * | 8/1992 | Fries et al. ............... 219/86.51 |
| 5,230,458 A | * | 7/1993 | Asanasavest ................. 228/102 |
| 5,240,165 A | * | 8/1993 | Geyer et al. ................. 228/102 |
| 5,285,946 A | * | 2/1994 | Tomigashi et al. ............. 228/9 |
| 5,351,872 A | * | 10/1994 | Kobayashi ................... 228/6.2 |
| 5,368,217 A | * | 11/1994 | Simmons et al. ............. 228/6.2 |
| 5,586,713 A | * | 12/1996 | Arita et al. .................. 228/102 |
| 5,673,844 A | * | 10/1997 | Sargent ....................... 228/102 |
| 5,696,329 A | | 12/1997 | Silverio de Magalhaes Machado et al. |
| 5,950,903 A | | 9/1999 | Farassat |
| 5,985,064 A | * | 11/1999 | Sato ............................. 156/64 |
| 6,119,917 A | * | 9/2000 | Takahashi et al. ........... 228/102 |
| 2002/0030089 A1 | * | 3/2002 | Leu |
| 2002/0050507 A1 | * | 5/2002 | Takeishi et al. |
| 2002/0092887 A1 | * | 7/2002 | Hosotani et al. |

FOREIGN PATENT DOCUMENTS

| | | | |
|---|---|---|---|
| JP | 401112738 A | * | 5/1989 |
| JP | 402066951 A | * | 3/1990 |
| JP | 402068939 A | * | 3/1990 |
| JP | 4 162730 | | 6/1992 |
| JP | 404162730 A | * | 6/1992 |

* cited by examiner

Primary Examiner—Tom Dunn
Assistant Examiner—Kiley Stoner
(74) Attorney, Agent, or Firm—Burns, Doane, Swecker & Mathis, L.L.P.

(57) ABSTRACT

An apparatus and method are disclosed for providing bond force in a die bonding operation. The apparatus comprises means such as a compression spring for generating a primary bond force, and additionally means such as a voice coil for generating a compensatory bond force. The compensatory bond force can be controlled by varying the current to the voice coil so as to add to or reduce the bond force whereby a bond force comprising the sum of the primary bond force and the compensatory bond force may be controlled.

19 Claims, 2 Drawing Sheets

APPARATUS AND METHOD FOR BOND FORCE CONTROL

FIELD OF THE INVENTION

This invention relates to an apparatus and method for bond force control, and in particular to such control in a die bonding operation.

BACKGROUND OF THE INVENTION

In a die bonding operation in a semiconductor assembly and manufacturing process, a bond head may pick a die (which may be an electronic device such as a semiconducting integrated circuit device) at a first location and will move the die to a second location at which the die is to be bonded to a substrate, such as a circuit board. The bond head will then move downwardly (this is known as the z-direction) until the die touches the substrate. In order to apply a required bond force during the bond operation, the bond head may be driven downwardly further to exert a required force on the die.

Apparatus and methods for controlling this bond force need to meet a number of conflicting requirements. For example, they should preferably be able to apply a bond force over a wide range, should be susceptible to feedback and control, and should be able to respond rapidly to required changes in the bond force.

PRIOR ART

To date prior art techniques have failed to satisfactorily meet all the requirements for ideal bond force control. Conventionally bond force control is achieved using a compression spring, or a pneumatic actuator, or a solenoid, and a number of examples of such conventional prior art bond force control techniques will now be shown.

FIG. 1 shows a compression spring type system. In such a system a compression spring 1 is mounted within the bond head 3 and exerts a force on a moving assembly 2 that connects to a collet bearing the die. In a die bonding process a die will be held (for example by vacuum) to a collet formed as part of the moving assembly 2. The bond head is moved downwardly in the z-direction until the die touches the substrate. In order to exert a bonding force the bond head 3 is continued to move in the z-direction so as to compress the spring 1 against the moving assembly 2 and to exert a bond force on the die through the collet.

In order to avoid excess vibrations of the moving assembly 2 during motion of the bond head 3, the spring 1 is usually preloaded and the amount of preload directly affects the minimum bond force that can be applied. The larger the preload, the larger is the minimum bond force that can be applied. This is because when the collet and die touch the substrate (which is a rigid surface), the reaction force that pushes the collet and die against the spring should be larger than the preload of the spring. This means that if a very small bond force is required, the preload of the spring must also be very small, but this in turn has the disadvantage of resulting in more vibrations of the bond head following movement which will thus require a longer settling time in the bonding operation.

Another problem that arises from simply reducing the preload of the spring to enable a small bonding force to be applied, is that the contact of the spring with the moving assembly 2 and the bond head housing 3 may be poor and the bond force may be non-linear. This can be mitigated by reducing the spring constant k so that a larger extent of compression, good contact, and small preload can all be obtained at the same time. The price for this, however, is that the range of the output force produced by the spring is reduced and this method can only really work with small bond force applications.

U.S. Pat. No. 5,950,903 discloses a system similar to the use of a compression spring, but using a leaf spring instead of a compression spring.

FIG. 2 shows a schematic of a prior art example that uses a pneumatic actuator instead of a compression spring. A pressure chamber 4 is provided within the bond head housing 6 and acting upon the moving collet assembly 5. In this arrangement a variable bond force can be applied by controlling the pressure within the pressure chamber 4. A difficulty with this design, however, is that the response time is slow. If the pressure in the chamber 4 is controlled using a pressure regulator the response time is too slow for a real time closed loop control system and instead an open loop control is used instead. A related disadvantage is that there is a relatively large impact force. At the moment that the die touches the substrate surface an impact force is produced that acts upon the die. If this impact force is too large it can damage the die, but the slow response time of a pneumatic system makes it very difficult to control the impact force. It is also difficult to control the bond force with any great accuracy.

In solenoid systems such as those described for example in U.S. Pat. Nos. 3,727,822, 4,603,802, 5,230458 and 5,696,329 a solenoid is used in place of a compression spring or a pneumatic actuator to provide the bond force. Solenoid systems have a number of advantages, including fast response times, the ability to incorporate closed-loop control, and easy accurate control. The main disadvantage, however, is that the output bond force is relatively small, and to create a large bond force when such is required, a large and correspondingly heavy solenoid must be used. Generally, solenoid systems are only suitable for use in applications where a small bond force is required.

SUMMARY OF THE INVENTION

It is an object of the invention to provide an apparatus and method for providing bond force control that facilitates the generation of a bond force over a wide range of values, allows fast response and closed loop control, and is simple in design and construction.

According to the present invention therefore there is provided apparatus for providing bond force in a die bonding operation, comprising means for generating a primary bond force, means for generating a compensatory bond force, and means for controlling the compensatory bond force whereby a bond force comprising the sum of the primary bond force and the compensatory bond force may be controlled. The compensatory bond force may be directed either in the same direction as the primary bond force or in the opposite direction to the primary bond force.

The primary bond force generating means may comprise a preloaded compression spring (other possibilities include a leaf spring or a pneumatic actuator). The compensatory bond force generating means preferably comprises a motor.

Preferably a force sensor is provided for sensing the applied bond force, and for producing an output for controlling the compensatory bond force generating means.

The primary bond force generating means may be movable relative to a die holding means whereby the bond force component provided by the primary bond force generating means may be varied by moving the primary bond force generating means relative to said die holding means (i.e. by driving in).

Viewed from another broad aspect the present invention provides a method of generating a desired bond force in a die bonding operation, comprising: providing a primary bond force, generating a compensatory bond force in the same direction or opposite to said primary bond force, summing said primary bond force and said compensatory bond force to generate said bond force, and controlling the magnitude and sign of said compensatory bond force to control said generated bond force.

Preferably the method further comprises sensing an instantaneous bond force, and controlling the compensatory bond force in response to the sensed instantaneous bond force. The compensatory bond force is preferably generated by a motor comprising a motor coil, and the magnitude and sign of the compensatory force may be controlled by varying the magnitude and direction of a current applied to the coil.

The primary bond force may comprise a preload component, and the generated bond force comprises the sum of said preload component and the compensatory bond force. The primary bond force may also include a variable component, and the generated bond force may then comprise the sum of the preload component, the variable component and said compensatory bond force.

The present invention also provides a method of controlling the impact force in a die bonding operation, comprising moving a bond head bearing a die toward a substrate in a first direction, and providing means for generating a compensatory force in a direction opposite to said first direction at the moment of impact of said die on said substrate.

The present invention still further provides a method of preventing vibrations of a collet assembly in a die bond head during movement of the said bond head either in the z direction prior to engaging the substrate or translational movement, comprising generating a force to move said collet assembly against a stop means while said bond head is being moved.

BRIEF DESCRIPTION OF THE DRAWINGS

An embodiment of the invention will now be described by way of example and with reference to the accompanying drawings, in which.

DETAILED DESCRIPTION OF PREFERRED EMBODIMENT

An embodiment of the present invention will now be described with reference to FIGS. 3 and 4. As will be seen in more detail from the following description, an important aspect of the present invention is that the apparatus and method involves the provision of a first primary bond force generating means such as a compression spring, and a second compensatory bond force generating means that is capable of rapidly and accurately generating a compensating bond force that may be positive or negative to provide fine control of the primary bond force. This compensatory bond force may be generated, for example, by a motor.

Figure 1:
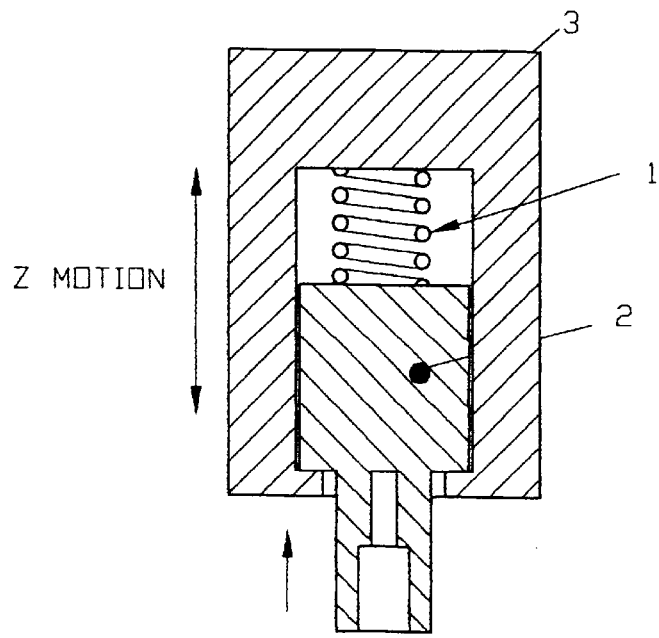
FIG. 1 is a sectional view through a first example of the prior art.
Figure 2:
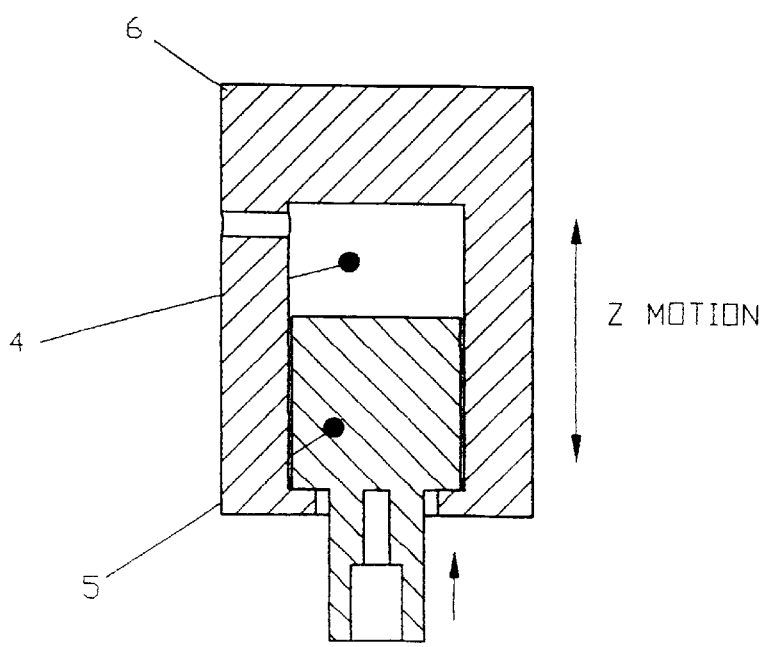
FIG. 2 is a sectional view through a second example of the prior art.
Figure 3:
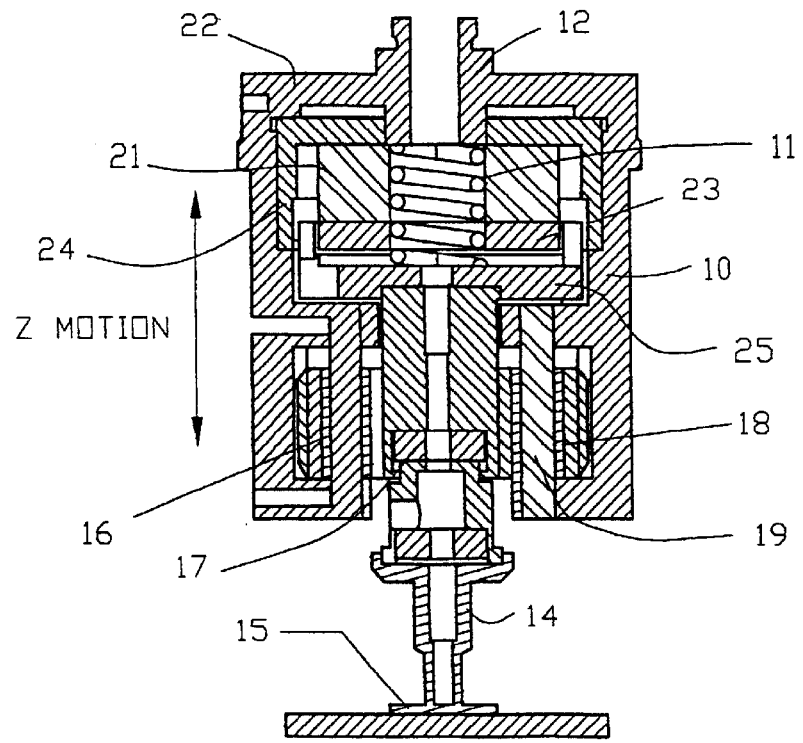
FIG. 3 is a sectional view through an embodiment of the invention showing the application of a small bond force.
Figure 4:
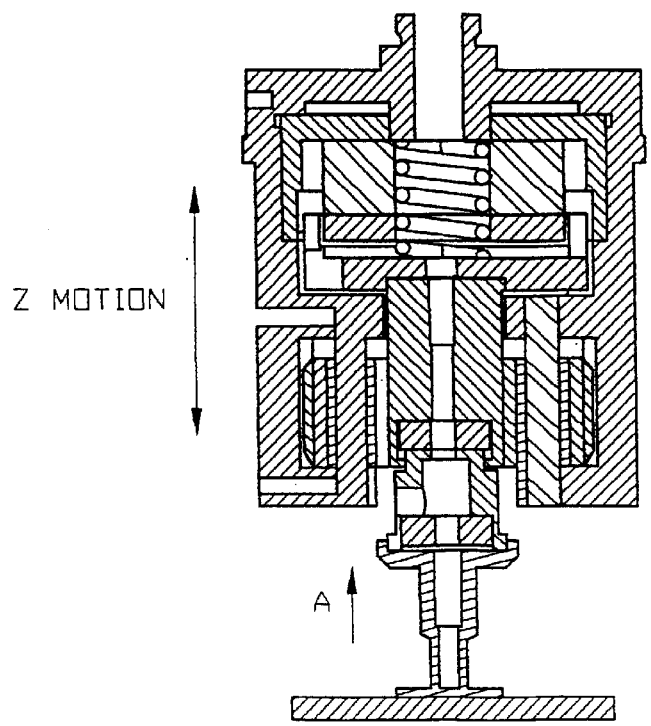
FIG. 4 is a sectional view through the embodiment of FIG. 3 showing the application of a larger bond force.

Referring to FIGS. 3 and 4, a bond head according to an embodiment of the invention comprises a bracket 10 for supporting the bond force generating means. The primary bond force generating means comprises a compression spring 11 fixed between one end of a shaft 12 and a mount 25 for a bond force motor coil to be described below. Compression spring 11 is provided with a preload P and can act upon a collet assembly 14 and die 15 through a slider mount 16. A force sensor 17 is located between the slider mount 16 and the collet assembly 14. Collet assembly 14 is fixed to slider mount 16 which is formed with bearings 18 that allow the slider mount 16 to slide relative to sliders 19 two of which are formed parallel to the axis of the spring 11, slider mount 16, force sensor 17 and collet assembly 14 (this axis lying on the z-direction). It will thus be understood that the collet assembly 14 may slide relative to the bracket 10 in the z-direction. Collet assembly 14 is adapted to pick and hold a semiconductor die 15 by suction.

A compensatory bond force generating means is provided in the form of a bond force motor comprising an annular magnet 21 surrounding the spring 11 and sandwiched between a ferromagnetic core 22 and a ferromagnetic plate 23. A bond force motor coil 24 is supported on coil mount 25 and is provided in the annular space defined between the edge of the plate 23 and a downwardly extending annular flange portion of the core 22. It will be understood that by the application of a current to the motor coil 24 a force may be generated in the z-direction that acts upon the collet assembly 14. Depending on the direction of the current flow in the coil 24, this force may be positive (i.e. downwardly in the z-direction towards the substrate) and will act in addition to the compression spring, or may be negative (i.e. upwardly in the z-direction away from the substrate) and will act against the compression spring. As will be seen from the following, the current applied to the coil 24 may be controlled in response to the output of the force sensor to provide a closed loop control of the bond force.

The operation of the embodiment of the present invention will now be described in situations (a) where a small bond force is required, and (b) where a large bond force is required.

It will be understood that to begin with the bond head is moved to a location to pick a semiconductor die. The die may be held to the collet assembly 14 by vacuum in a conventional manner and is carried to a bonding location where the die is to be bonded to a substrate. The bond head is then moved downwardly in the z-direction until the die touches the substrate. This point can be detected by the force sensor.

The first situation (a) may be considered to be described by the equation $F<F_{mmax}+P$ where F is the required bond force, P is the preload of the compression spring and $F_{mmax}$ is the maximum force generated by the bond force motor. In this situation the bond force can be controlled solely by varying the output of the bond force motor by varying the current applied to the motor coil. In particular, if the required bond force is greater than the preload of the compression spring, a positive downward force $F_m$ may be generated by the bond force motor that acts in addition to the preload P of the spring to provide the required bonding force. The force sensor can be used to provide a feedback control of the current supplied to the coil so that the bond motor force is accurately controlled which in turn will accurately control the bond force. Similarly if the required bond force F is smaller than the preload P of the spring, this can be achieved by supplying an opposite current to the bond force motor coil so that the bond force motor generates a negative force that acts upwardly against the compression spring. Again this negative bond motor force can be accurately controlled by a closed loop control using the force sensor.

Situation (b) may be considered to be represented by the equation $F \geq F_{mmax}+P$. In this situation the required bond force is obtained by controlling the force $F_m$ of the bond force motor and the force $F_s$ generated by the spring. The force generated by the bond force motor is controlled by supplying a current to the motor coil as discussed above. The force generated by the spring is controlled by moving the bond head further downwardly towards the substrate surface. The collet assembly and die cannot move any further, and therefore there is a relative movement z of the collet assembly and die in the direction of the arrow A in FIG. 4 that serves to compress the spring by a distance z and the force generated by the spring will increase to P+kz where k is the spring constant of the spring. Thus the total bond force is $F_m+P+kz$ and this can be controlled rapidly and accurately by varying the current to the motor coil to change $F_m$ in response to closed loop control from the force sensor.

In practice the situations (a) and (b) may not always be clearly defined and the border between them may be unclear. In particular the methodology of (b), in which the spring force component is increased by driving in the bond head, may also be applied in scenario (a).

It will be understood that in this embodiment of the present invention there is provided a primary bond force generating means in the form of the compression spring (though this could be replaced by a leaf spring or by a pneumatic actuator). In addition, however, there is also provided a compensatory bond force generating means in the form of a bond force motor. The compression spring provides the main element of the bond force with all the advantages of a compression spring (simple construction, large available range of bond force), but the addition of a positive or negative compensatory bond force from the bond force motor allows the total bond force to be rapidly and accurately controlled by means of a closed loop control of the current supplied to the motor coil.

It should also be noted that in addition to providing accurate control of the bond force in both small and high bond force applications, a further advantage of the present invention is that it allows the impact force to be minimized. This can be achieved by allowing the bond force motor to generate a negative bond force at the moment of impact and before the bonding process is commenced. In addition, another advantage is that vibration of the bond head during movement can be reduced using the embodiment of the invention. In particular during movement of the bond head (either in the z direction prior to engaging the substrate) or when moving in the x and y directions to pick a die and to carry it to the bonding location, vibrations of the collet assembly within the bond head can be reduced by using the bond force motor to generate a negative bond force that causes the collet assembly to move upwardly relative to the remainder of the bond head as far as it can until it reaches a stop position.

What is claimed is:

1. Apparatus for providing bond force in a die bonding operation, comprising means for generating a primary bond force, means for generating a compensatory bond force, and means for controlling the compensatory bond force whereby a bond force comprising the sum of the primary bond force and the compensatory bond force may be controlled.

2. Apparatus as claimed in claim 1 wherein said compensatory bond force may be directed either in the same direction as the primary bond force or in the opposite direction to the primary bond force.

3. Apparatus as claimed in claim 1 wherein said primary bond force generating means comprises a preloaded compression spring.

4. Apparatus as claimed in claim 1 wherein said compensatory bond force generating means comprises a motor.

5. Apparatus as claimed in claim 1 further comprising a force sensor for sensing the applied bond force, and for producing an output for controlling the compensatory bond force generating means.

6. Apparatus as claimed in claim 1 wherein the primary bond force generating means comprises a leaf spring or a pneumatic actuator.

7. Apparatus as claimed in claim 1 wherein said primary bond force generating means is movable relative to a die holding means whereby the bond force component provided by said primary bond force generating means may be varied by moving said primary bond force generating means relative to said die holding means.

8. Apparatus as claimed in claim 1 wherein said primary bond force generating means comprises a spring, and said compensatory bond force generating means comprises a motor including a coil, wherein the direction and magnitude of the compensatory bond force may be changed by changing the direction of a current applied to said motor coil, and said apparatus further comprising a bond force sensor for sensing the bond force and for controlling the said current applied to said coil to maintain a desired bond force.

9. The apparatus of claim 8 wherein said motor coil surrounds said spring.

10. The apparatus of claim 8 wherein said motor generates a bi-directional force that respectively opposes or complements the force of said spring.

11. An apparatus for providing a bond force along a bonding axis in a die bonding operation, comprising:
   a housing;
   a die holding means mounted in said housing for movement relative to said housing along said bonding axis;
   a primary bond force generator that generates a force which opposes movement of said die holding means relative to said housing in a first direction along said axis; and
   a compensatory bond force generator mounted in said housing that moves said die holding means bidirectionally relative to said housing along said axis.

12. The apparatus of claim 11 wherein said compensatory bond force generator comprises a motor having a coil that surrounds said primary bond force generator.

13. The apparatus of claim 11 further including a sensor for sensing the force applied to said die holding means, and a controller responsive to the sensed force for controlling said compensatory bond force generator.

14. A method of generating a desired bond force in a die bonding operation, comprising: providing a primary bond force, generating a compensatory bond force in the same direction or opposite to said primary bond force, summing said primary bond force and said compensatory bond force to generate said bond force, and controlling the magnitude and sign of said compensatory bond force to control said generated bond force.

15. A method as claimed in claim 14 comprising sensing an instantaneous bond force, and controlling said compensatory bond force in response to said sensed instantaneous bond force.

16. A method as claimed in claim 15 wherein said compensatory bond force is generated by a motor comprising a motor coil, and wherein the magnitude and sign of said compensatory force is controlled by varying the magnitude and direction of a current applied to said coil.

17. A method as claimed in claim 14 wherein said primary bond force comprises a preload component, and wherein the generated bond force comprises the sum of said preload component and said compensatory bond force.

18. A method as claimed in claim 14 wherein said primary bond force comprises a preload component and a variable component, and wherein the generated bond force comprises the sum of said preload component, said variable component and said compensatory bond force.

19. A method of controlling the impact force in a die bonding operation, comprising moving a bond head bearing a die toward a substrate in a first direction, and providing means for generating a compensatory force in a direction opposite to said first direction at the moment of impact of said die on said substrate.

* * * * *